US012733276B2

(12) United States Patent
Bak

(10) Patent No.: US 12,733,276 B2
(45) Date of Patent: Sep. 8, 2026

(54) IMAGE SENSING DEVICE INCLUDING GRID STRUCTURE WITH AIR LAYER

(71) Applicant: SK hynix Inc., Icheon-si (KR)

(72) Inventor: Ho Jin Bak, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 587 days.

(21) Appl. No.: 17/833,450

(22) Filed: Jun. 6, 2022

(65) Prior Publication Data

US 2023/0154955 A1 May 18, 2023

(30) Foreign Application Priority Data

Nov. 18, 2021 (KR) ........................ 10-2021-0159553

(51) Int. Cl.
*H10F 39/00* (2025.01)

(52) U.S. Cl.
CPC ....... *H10F 39/8053* (2025.01); *H10F 39/802* (2025.01)

(58) Field of Classification Search
CPC ......... H01L 27/14621; H01L 27/14603; H01L 27/14623; H01L 27/14627; H01L 27/14645; H01L 27/14685; H01L 27/1463; H01L 27/14683; H01L 27/14636; H04N 25/11
See application file for complete search history.

(56) References Cited

U.S. PATENT DOCUMENTS

2013/0077090 A1 3/2013 Ahn
2019/0067356 A1 2/2019 Lin et al.
2020/0243579 A1* 7/2020 Pyo .................. H01L 27/14627
2021/0118929 A1* 4/2021 Yang ................. H01L 27/14623

FOREIGN PATENT DOCUMENTS

CN 112117287 A 12/2020
CN 112687707 A 4/2021

OTHER PUBLICATIONS

Notice of Allowance for CN Appl. No. 202210560436.0, mailed on Apr. 29, 2026, 4 pages.

* cited by examiner

*Primary Examiner* — Norman D Richards
*Assistant Examiner* — Ethan Edward Cutler
(74) *Attorney, Agent, or Firm* — Ashurst Perkins Coie US LLP

(57) ABSTRACT

An image sensing device includes a plurality of color filter blocks, each of which includes a plurality of color filters arranged adjacent to each other in a first direction and a second direction perpendicular to the first direction and having the same color, first grid structures including a first air layer and disposed between the color filter blocks adjacent to each other in the first direction; second grid structures including a second air layer and disposed between the color filter blocks adjacent to each other in the second direction, and a third grid structure including a third air layer and disposed between the color filters within each of the color filter blocks. The first to third air layers are structurally separate from each other.

20 Claims, 15 Drawing Sheets

IMAGE SENSING DEVICE INCLUDING GRID STRUCTURE WITH AIR LAYER

CROSS-REFERENCE TO RELATED APPLICATION

This patent document claims the priority and benefits of Korean patent application No. 10-2021-0159553, filed on Nov. 18, 2021, which is incorporated by reference in its entirety as part of the disclosure of this patent document.

TECHNICAL FIELD

The technology and implementations disclosed in this patent document generally relate to an image sensing device.

BACKGROUND

An image sensor is used in electronic devices to convert optical images into electrical signals. With the recent development of automotive, medical, computer and communication industries, the demand for highly integrated, higher-performance image sensors has been rapidly increasing in various electronic devices such as digital cameras, camcorders, personal communication systems (PCSs), video game consoles, surveillance cameras, medical micro-cameras, robots, and others.

The image sensing device may be roughly divided into CCD (Charge Coupled Device) image sensing devices and CMOS (Complementary Metal Oxide Semiconductor) image sensing devices. The CCD image sensing devices offer a better image quality, but they tend to consume more power and are larger as compared to the CMOS image sensing devices. The CMOS image sensing devices are smaller in size and consume less power than the CCD image sensing devices. Furthermore, CMOS sensors are fabricated using the CMOS fabrication technology, and thus photosensitive elements and other signal processing circuitry can be integrated into a single chip, enabling the production of miniaturized image sensing devices at a lower cost. For these reasons, CMOS image sensing devices are being developed for many applications including mobile devices.

SUMMARY

Various embodiments of the disclosed technology relate to an image sensing device that includes grid structures with air layers that can minimize signal deviation between pixels while improving structural stability of the grid structure.

In an embodiment of the disclosed technology, an image sensing device may include a plurality of color filter blocks, each of which includes a plurality of color filters arranged adjacent to each other in a first direction and a second direction perpendicular to the first direction and having the same color; first grid structures including a first air layer and disposed between the color filter blocks adjacent to each other in the first direction; second grid structures including a second air layer and disposed between the color filter blocks adjacent to each other in the second direction; and a third grid structure including a third air layer and disposed between the color filters within each of the color filter blocks, wherein the first to third air layers are structurally separate from each other.

In another embodiment of the disclosed technology, an image sensing device may include a color filter block including a plurality of color filters arranged adjacent to each other in a first direction and a second direction perpendicular to the first direction; a plurality of first grid structures disposed along boundary regions located at first and third sides of the color filter block arranged in the first direction; a plurality of second grid structures disposed along boundary regions located at second and fourth sides of the color filter block arranged in the second direction; and a third grid structure disposed between the color filters within the color filter block, wherein the first to third grid structures include air layers that are structurally separated from each other.

In another embodiment of the disclosed technology, an image sensing device may include a plurality of photosensing pixels operable to convert incident light into pixel signals, respectively; a plurality of color filter blocks, each of which includes a plurality of identical color filters to transmit light of an identical color and arranged adjacent to each other in a first direction and a second direction perpendicular to the first direction, wherein the color filter blocks are positioned above the photosensing pixels to filter incident light to be received by the photosensing pixels; first grid structures extending in the first direction, each of the first grid structures including a first air layer and disposed between the color filter blocks adjacent to each other; second grid structures extending in the second direction, each of the second grid structures including a second air layer and disposed between the color filter blocks adjacent to each other; and a third grid structure including branches extending in the first direction or the second direction, each branch including a third air layer and disposed between the color filters within each of the color filter blocks, wherein the first to third air layers are structurally separate from each other.

In another embodiment of the disclosed technology, an image sensing device may include a plurality of color filter blocks, each of which includes a plurality of color filters having the same color such that the color filters having the same color are arranged adjacent to each other in a first direction and a second direction perpendicular to the first direction; first grid structures, each of which includes a first air layer, disposed between the color filter blocks adjacent to each other in the first direction; second grid structures, each of which includes a second air layer, disposed between the color filter blocks adjacent to each other in the second direction; and a third grid structure configured to include a third air layer, and disposed between the color filters within each of the color filter blocks, wherein the first to third air layers are isolated from each other.

In another embodiment of the disclosed technology, an image sensing device may include a color filter block including a plurality of color filters arranged adjacent to each other in a first direction and a second direction perpendicular to the first direction; a plurality of first grid structures disposed at boundary regions located at both sides of the color filter block arranged in the first direction; a plurality of second grid structures disposed at boundary regions located at other both sides of the color filter block arranged in the second direction; and a third grid structure disposed between the color filters within the color filter block, wherein the first to third grid structures include air layers isolated from each other.

It is to be understood that both the foregoing general description and the following detailed description of the disclosed technology are illustrative and explanatory and are intended to provide further explanation of the disclosure as claimed.

As is apparent from the above description, the image sensing device based on some implementations of the disclosed technology can increase structural stability of a grid structure including an air layer by improving a structure of the grid structure, thereby minimizing signal deviation between pixels.

DETAILED DESCRIPTION

This patent document provides implementations and examples of an image sensing device and the disclosed features may be implemented to achieve one or more advantages in more applications. Some implementations of the disclosed technology suggest designs of an image sensing device capable of minimizing signal deviation between pixels while improving structural stability of a grid structure including an air layer. The disclosed technology provides various implementations of an image sensing device which can increase structural stability of a grid structure including an air layer by improving a structure of the grid structure, thereby minimizing signal deviation between pixels.

Reference will now be made in detail to certain embodiments, examples of which are illustrated in the accompanying drawings. Wherever possible, the same reference numbers will be used throughout the drawings to include the same or similar parts. In the following description, a detailed description of related known configurations or functions incorporated herein will be omitted to avoid obscuring the subject matter.

Hereafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

Figure 1:
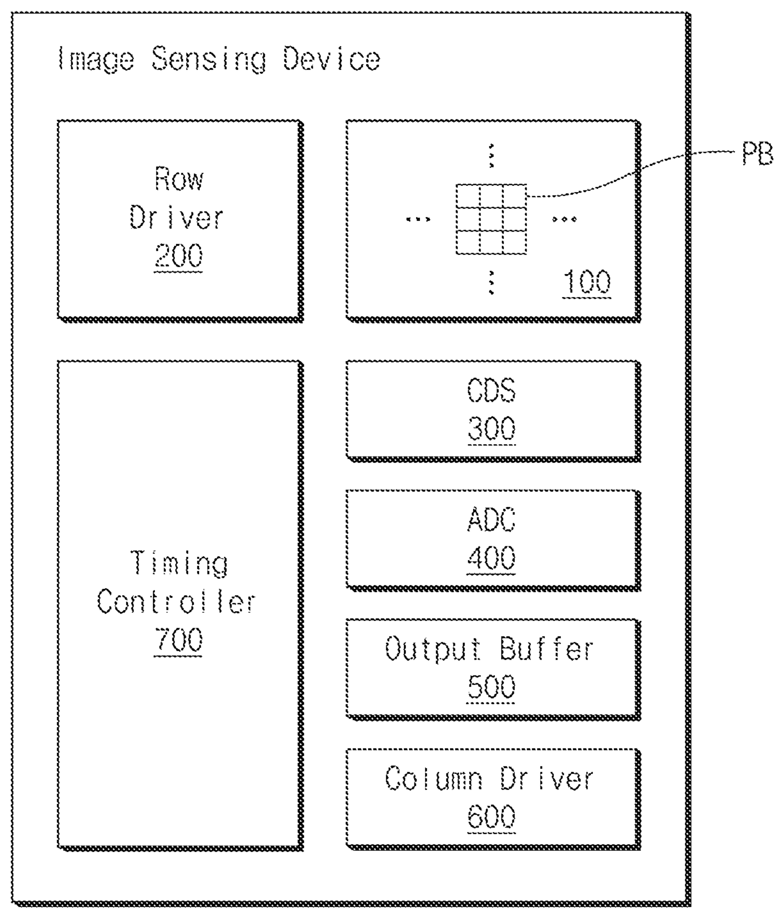
FIG. 1 is a block diagram illustrating an example of an image sensing device based on some implementations of the disclosed technology.

FIG. 1 is a block diagram illustrating an image sensing system based on some implementations of the disclosed technology.

Referring to FIG. 1. 1, the image sensing device 10 may include a pixel array 100, a row driver 200, a correlated double sampler (CDS) 300, an analog-digital converter (ADC) 400, an output buffer 500, a column driver 600 and a timing controller 700.

The pixel array 100 may include a plurality of sub-pixel blocks (PBs) consecutively arranged in row and column directions. Each sub-pixel block (PB) may include a plurality of unit pixels configured to be photosensitive and operable to generate an electrical signal (pixel signal) in response to incident light through a photo-electrical conversion of incident light. In this case, each sub-pixel block (PB) may include a structure (nona pattern structure) in which the unit pixels having color filters of the same color are arranged adjacent to each other in an (N×N) array (where, N is a natural number of 3 or greater). The color filters may include a red color filter, a green color filter, and a blue color filter. The adjacent sub-pixel blocks (PBs) may be arranged such that the red color filter, the green color filter, and the blue color filter are arranged in a suitable color pattern to capture coloring information of an image in the incident light such as a Bayer pattern with 25% in red, 50% in green and 25% in blue. A grid structure for preventing crosstalk between the color filters may be disposed between the color filters adjacent to each other.

The pixel array 100 may receive driving signals (for example, a row selection signal, a reset signal, a transmission (or transfer) signal, etc.) from the row driver 200. Upon receiving the driving signal, the unit pixels may be activated to perform the operations corresponding to the row selection signal, the reset signal, and the transfer signal.

The row driver 200 may activate the pixel array 100 to perform certain operations on the unit pixels in the corresponding row based on control signals provided by controller circuitry such as the timing controller 700. In some implementations, the row driver 200 may select one or more pixel groups arranged in one or more rows of the pixel array 100. The row driver 200 may generate a row selection signal to select one or more rows from among the plurality of rows. The row driver 200 may sequentially enable the reset signal and the transfer signal for the unit pixels arranged in the selected row. The pixel signals generated by the unit pixels arranged in the selected row may be output to the correlated double sampler (CDS) 300.

The correlated double sampler (CDS) 300 may remove undesired offset values of the unit pixels using correlated double sampling. In one example, the correlated double sampler (CDS) 300 may remove the undesired offset values of the unit pixels by comparing output voltages of pixel signals (of the unit pixels) obtained before and after photocharges generated by incident light are accumulated in the sensing node (i.e., a floating diffusion node FD). As a result, the CDS 300 may obtain a pixel signal generated only by the incident light without causing noise. In some implementations, upon receiving a clock signal from the timing controller 700, the CDS 300 may sequentially sample and hold voltage levels of the reference signal and the pixel signal, which are provided to each of a plurality of column lines from the pixel array 100. That is, the CDS 300 may sample and hold the voltage levels of the reference signal and the pixel signal which correspond to each of the columns of the pixel array 100. In some implementations, the CDS 300 may transfer the reference signal and the pixel signal of each of the columns as a correlate double sampling (CDS) signal to the ADC 400 based on control signals from the timing controller 700.

The ADC 400 is used to convert analog CDS signals received from the CDS 300 into digital signals. In some implementations, the ADC 400 may be implemented as a ramp-compare type ADC. The analog-to-digital converter (ADC) 400 may compare a ramp signal received from the timing controller 700 with the CDS signal received from the CDS 300, and may thus output a comparison signal indicating the result of comparison between the ramp signal and the CDS signal. The analog-to-digital converter (ADC) 400 may count a level transition time of the comparison signal in response to the ramp signal received from the timing controller 700, and may output a count value indicating the counted level transition time to the output buffer 500.

The output buffer 500 may temporarily store column-based image data provided from the ADC 400 based on control signals of the timing controller 170. The image data received from the ADC 400 may be temporarily stored in the output buffer 500 based on control signals of the timing controller 700. The output buffer 500 may provide an interface to compensate for data rate differences or transmission rate differences between the image sensing device and other devices.

The column driver 600 may select a column of the output buffer 500 upon receiving a control signal from the timing controller 700, and sequentially output the image data, which are temporarily stored in the selected column of the output buffer 500. In some implementations, upon receiving an address signal from the timing controller 700, the column driver 600 may generate a column selection signal based on the address signal, may select a column of the output buffer 500 using the column selection signal, and may control the image data received from the selected column of the output buffer 500 to be output as an output signal.

The timing controller 700 may generate signals for controlling operations of the row driver 200, the ADC 400, the output buffer 500 and the column driver 600. The timing controller 700 may provide the row driver 200, the column driver 600, the ADC 400, and the output buffer 500 with a clock signal required for the operations of the respective components of the image sensing device, a control signal for timing control, and address signals for selecting a row or column. In some implementations, the timing controller 700 may include a logic control circuit, a phase lock loop (PLL) circuit, a timing control circuit, a communication interface circuit and others.

Figure 2:
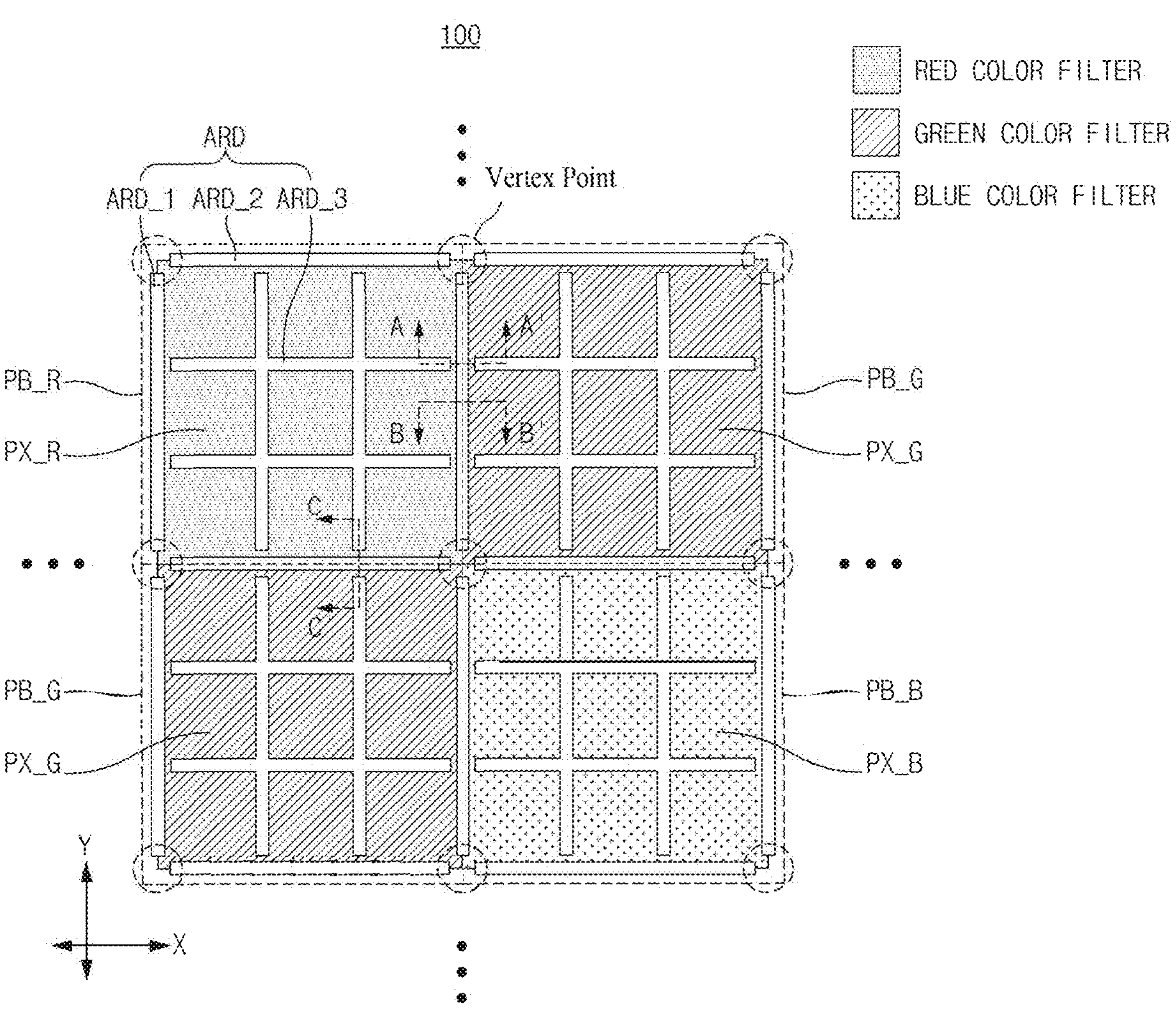
FIG. 2 is a plan view of a grid structure arranged in a pixel array shown in FIG. 1 based on some implementations of the disclosed technology.

FIG. 2 is a plan view of a grid structure arranged in the pixel array 100 shown in FIG. 1.

Referring to FIG. 2, the pixel array 100 may include a plurality of sub-pixel blocks PB_R, PB_G, and PB_B. The sub-pixel block (PB_R) may include a plurality of unit pixels (PX_R) configured to generate an electrical signal (pixel signal) corresponding to incident light through conversion of the incident light. The sub-pixel block (PB_G) may include a plurality of unit pixels (PX_G) configured to generate an electrical signal (pixel signal) corresponding to incident light through conversion of the incident light. The sub-pixel block (PB_B) may include a plurality of unit pixels (PX_B) configured to generate an electrical signal (pixel signal) corresponding to incident light through conversion of the incident light. Each sub-pixel block PB_R, PB_G, or PB_B may include a structure in which the unit pixels PX_R, PX_G, or PX_B having color filters of the same color are arranged in an (N×N) structure (where N is a natural number of 3 or greater).

For example, the sub-pixel block (PB_R) may include 9 red color pixels (PX_R) that include red color filters, each of which transmits visible light having a first wavelength band. Here, the 9 red color filters may be arranged in a (3×3) array. The sub-pixel block (PB_G) may include 9 green color pixels (PX_G) that include green color filters, each of which transmits visible light having a second wavelength band shorter than the first wavelength band. Here, the 9 green color pixels (PX_G) may be arranged in a (3×3) array. The sub-pixel block (PB_B) may include 9 blue color pixels (PX_B) that include blue color filters, each of which transmits visible light having a third wavelength band shorter than the second wavelength band. Here, the 9 blue color pixels (PX_B) may be arranged in a (3×3) array. The red, green, and blue sub-pixel blocks PB_R, PB_G, and PB_B may be consecutively arranged in a Bayer pattern.

FIG. 2 illustrates sub-pixel blocks PB_R, PB_G, and PB_B as including 9 unit pixels with the same color filters arranged in a (3×3) array by way of example. In one example, the sub-pixel blocks PB_R, PB_G, and PB_B can have a "nona" pattern structure. In addition, although FIG. 2 illustrates only four sub-pixel blocks PB_R, PB_G, and PB_B that are adjacent to each other while being arranged in a Bayer pattern for convenience of description, the sub-pixel blocks PB_R, PB_G, and PB_B can be consecutively arranged in row and column directions.

In some embodiments of the disclosed technology, the pixel array 100 may include grid structures ARD to reduce the potential crosstalk between adjacent color filters. In some implementations, the grid structures ARD may be formed between color filters of blocks of unit pixels PX_R, PX_G, PX_B. Hereinafter, the plurality of color filters (e.g., 3 by 3 adjacent color filters of the same color filters in the 36 adjacent color filters shown in FIG. 2) based on sub-pixel block PB_R, PB_G, or PB_B will be referred to as a color filter block. In the example in FIG. 2, there are 4 pixel blocks each with 3×3 adjacent unit pixels. The colors of the color filter blocks are arranged based on a suitable color filter pattern for color imaging, such as the Bayer pattern as shown in FIG. 2.

In some implementations, the grid structures ARD may include first grid structures ARD_1, second grid structures ARD_2, and third grid structures ARD_3. Each of the first grid structures ARD_1 may extend in a first direction (e.g., Y-axis direction), and may be disposed between the color filter blocks of the adjacent sub-pixel blocks PB_R, PB_G, PB_B. For example, each of the first grid structures ARD_1 may extend in the first direction, and may be disposed between color filter blocks, for example, along a boundary between the adjacent color filter blocks arranged in a second direction (e.g., X-axis direction) perpendicular to the first direction.

Each of the second grid structures ARD_2 may extend in the second direction, and may be disposed between the color filter blocks of the adjacent sub-pixel blocks PB_R, PB_G, PB_B. For example, each of the second grid structures ARD_2 may extend in the second direction, and may be disposed between the color filter blocks arranged in the first direction.

In some implementations of the disclosed technology, the pixel array 100 includes different patterns of grid structures. In one example, grid structures ARD corresponding to some of adjacent unit pixels in a sub-pixel block PB_R, PB_G, or PB_B are connected to each other. In some implementations, the grid structures ARD includes a group of grid structures that are connected to each other. For example, the third grid structures ARD_3 include grid structures extending in first and second directions and connected to each other as illustrated in FIG. 2.

Each of the third grid structures ARD_3 may be disposed between the color filters within a region (e.g., each color filter block) surrounded by the first grid structure ARD_1 and the second grid structure ARD_2. For example, each of the third grid structures ARD_3 may have a hash symbol shape or a square shape in which a plurality of linear grid structures extending in the first direction and a plurality of other linear grid structures extending in the second direction are connected to each other or integrated into a single structure while being arranged to cross each other.

Each of the first to third grid structures ARD_1 to ARD_3 may include an air layer, and the air layers of the first to third grid structures ARD_1 to ARD_3 may be separated from each other. The first grid structures ARD_1 and the second grid structures ARD_2 may be arranged to surround the color filter blocks, and vertex regions of the color filter blocks may be separated from each other, leaving gaps or openings at the vertex regions.

A microlens for converging incident light may be formed over the color filters. Here, the pixel array 100 may have one microlens per unit pixel or per sub-pixel block PB_R, PB_G, or PB_B.

Figure 3A:
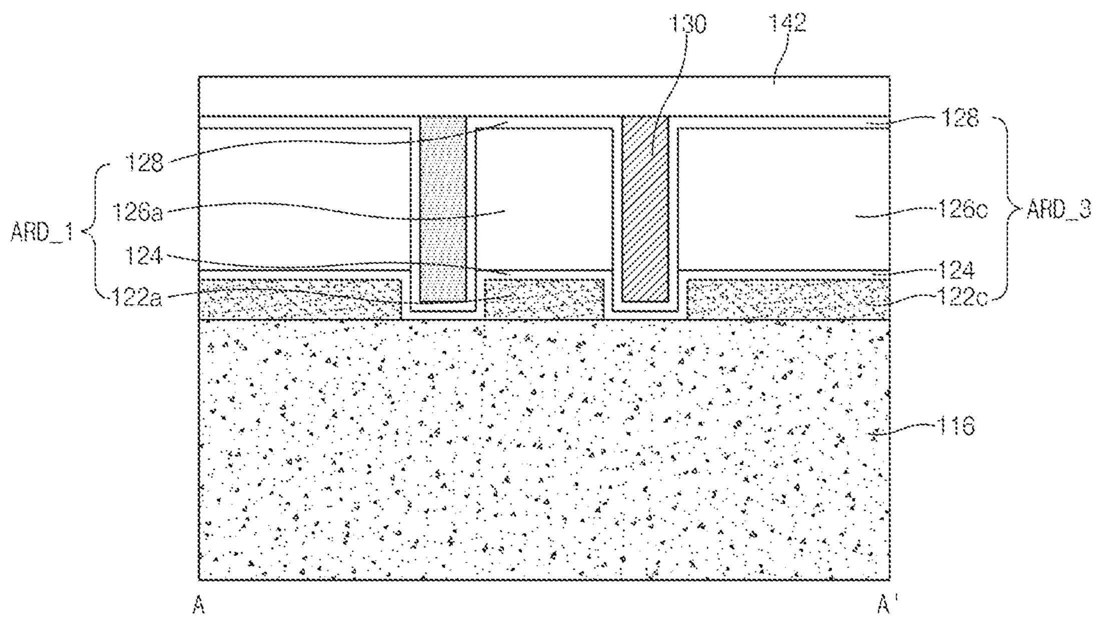
FIG. 3A is a cross-sectional view illustrating an example of a pixel array taken along the line A-A' shown in FIG. 2 based on some implementations of the disclosed technology.
Figure 3B:
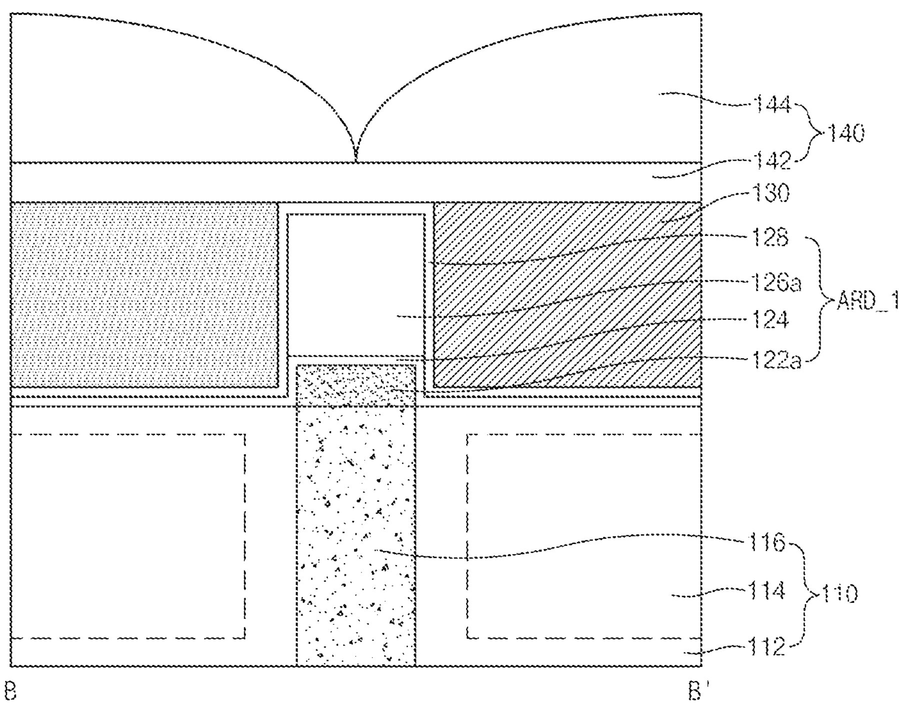
FIG. 3B is a cross-sectional view illustrating an example of a pixel array taken along the line B-B' shown in FIG. 2 based on some implementations of the disclosed technology.
Figure 3C:
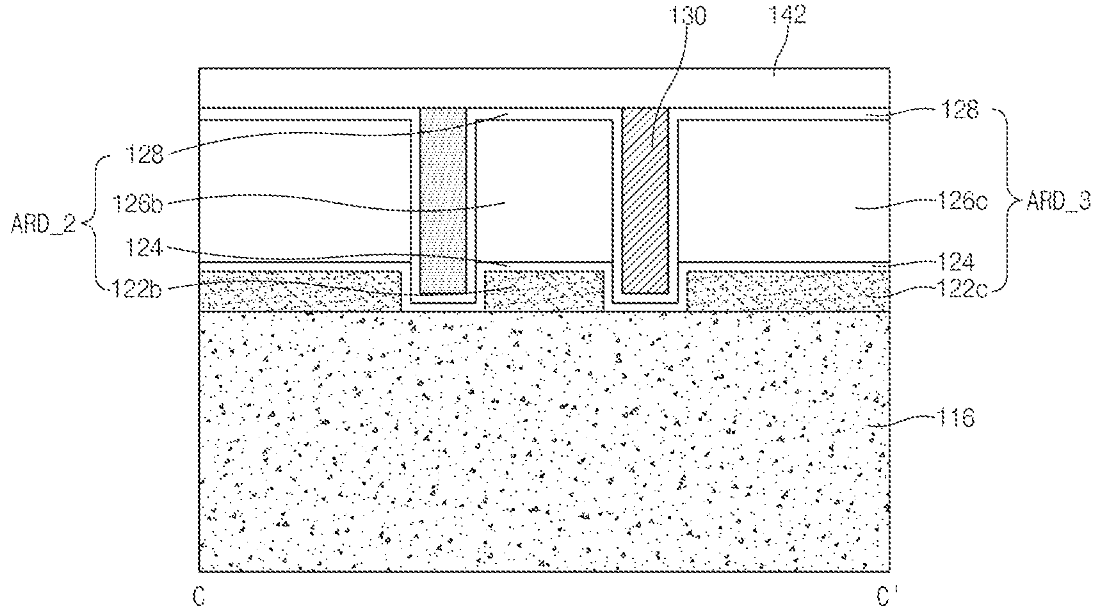
FIG. 3C is a cross-sectional view illustrating an example of a pixel array taken along the line C-C' shown in FIG. 2 based on some implementations of the disclosed technology.

FIG. 3A is a cross-sectional view illustrating an example of the pixel array taken along the line A-A' shown in FIG. 2. FIG. 3B is a cross-sectional view illustrating an example of the pixel array taken along the line B-B' shown in FIG. 2. FIG. 3C is a cross-sectional view illustrating an example of the pixel array taken along the line C-C' shown in FIG. 2.

Referring to FIGS. 2, 3A, 3B, and 3C, the pixel array 100 may include a substrate layer 110, a grid structure ARD, a color filter layer 130, and a lens layer 140.

The substrate layer 110 may include a semiconductor substrate 112, photoelectric conversion regions 114, and device isolation structures 116.

The semiconductor substrate 112 may include a bottom surface and a top surface facing away from each other (internally facing each other). In some implementations, the bottom surface of the semiconductor substrate 112 can be referred to as a front side and the top surface of the semiconductor substrate 112 can be referred to as a back side. Here, the back side may include a surface on which light is incident from the outside. For example, the substrate 112 may be a P-type or N-type bulk substrate, may be a substrate formed by growing a P-type or N-type epitaxial layer on the P-type bulk substrate, or may be a substrate formed by growing a P-type or N-type epitaxial layer on the N-type bulk substrate. The substrate 332 may include a P-type or N-type doped region 333 having P-type or N-type conductive impurities.

The photoelectric conversion regions 114 may be formed in the semiconductor substrate 112 and each of the photoelectric conversion regions 114 corresponds to each of the unit pixels. The photoelectric conversion elements 114 may perform photoelectric conversion of incident light (e.g., visible light) filtered by the color filter layer 130 to generate photocharges based on the incident light. Each of the photoelectric conversion regions 114 may include N-type impurities. In some implementations, the photoelectric conversion regions 114 may be formed by stacking a plurality of doped regions. For example, a lower doped region may be formed by implantation of $N^+$ ions, and an upper doped region may be formed by implantation of $N^-$ ions. The photoelectric conversion regions 114 may be arranged to occupy as large an area as possible to increase a fill factor indicating light reception efficiency.

Each of the device isolation structures 116 may be formed between photoelectric conversion regions 114 of the adjacent unit pixels within the semiconductor substrate 112, isolating the photoelectric conversion regions 114 from each other. The device isolation structure 116 may include a structure in which an insulation material is embedded in a trench formed by etching a portion of the semiconductor substrate. For example, the device isolation structure 116 may include a trench structure such as a Back Deep Trench Isolation (BDTI) structure or a Front Deep Trench Isolation (FDTI) structure. Alternatively, the device isolation structure 116 may include a junction isolation structure formed by implanting impurities (e.g., P-type impurities) at a high doping concentration into the semiconductor substrate 112.

The grid structure ARD may be located on the back side of the semiconductor substrate 112, and may be disposed between the color filters of the color filter layer 130 to reduce or minimize the potential crosstalk between adjacent color filters. The grid structure ARD may be formed over the device isolation structure 116 to overlap the device isolation structure 116.

The grid structure ARD may include first to third grid structures ARD_1 to ARD_3. Each of the first to third grid structures ARD_1 to ARD_3 may include a light absorption layer and a light reflection layer. The light absorption layer may include a metal layer, and the light reflection layer may include an air layer. The metal layer and the air layer may be isolated for each of the first to third grid structures ARD_1 to ARD_3.

The first grid structure ARD_1 may include a metal layer 122*a*, a first capping layer 124, an air layer 126*a*, and a second capping layer 128. The second grid structure ARD_2 may include a metal layer 122*b*, a first capping layer 124, an air layer 126*b*, and a second capping layer 128. The third grid structure ARD_3 may include a metal layer 122*c*, a first capping layer 124, an air layer 126*c*, and a second capping layer 128.

Each of the metal layers 122*a* to 122*c* may be formed of a metal material (e.g., tungsten W) having a high light absorption rate. In some implementations, each of the metal layers 122*a* to 122*c* may be formed by stacking different materials. For example, each of the metal layers 122*a* to 122*c* may further include a barrier metal layer (not shown) disposed under the tungsten (W) layer. The metal layers 122*a* to 122*c* may be separated from each other.

The air layers 126*a* to 126*c* may be formed over the first capping layer 124 to respectively overlap the metal layers 122*a* to 122*c*. Each of the air layers 126*a* to 126*c* may be filled with air. The air layers 126*a* to 126*c* may also be separated from each other. In other words, each of the first to third grid structures ARD_1 to ARD_3 may include a hybrid structure in which a metal layer and an air layer are stacked.

The first capping layer 124 may include a nitride layer, and may be formed to extend below the color filter layer 130 while covering the metal layers 122*a* to 122*c*. The first capping layer 124 may prevent the metal layers 122*a* to 122*c* from expanding during a thermal annealing process. In this case, a region formed below the color filter layer 130 may be used as a part of an anti-reflection layer.

The second capping layer 128 may be a material film formed at the outermost portion of the first to third grid structures ARD_1 to ARD_3, and may define regions where the air layers 126*a* to 126*c* are respectively formed in the first to third grid structures ARD_1 to ARD_3. The second capping layer 128 may include an oxide layer. The second capping layer 128 may be formed to extend below the color filter layer 130 while covering the air layer 127 and the metal layers 122*a* to 122*c*. The oxide layer may include an ultra-low temperature oxide (ULTO) film such as a silicon oxide ($SiO_2$) film. In this case, a region formed below the color filter layer 130 in the second capping layer 128 may be used as a part of the anti-reflection layer.

In each of the first capping layer 124 and the second capping layer 128, a region formed below the color filter layer 130 may serve as an anti-reflection layer that compensates for a difference in refractive indices between the color filter layer 130 and the substrate 112 such that light having passed through the color filter layer 130 can be effectively incident into the substrate 112.

The color filter layer 130 may include color filters that filter visible light from among incident light received through the lens layer 140 and transmit the filtered light to the corresponding photoelectric conversion elements 114. The color filter layer 130 may include a plurality of red color filters, a plurality of green color filters, and a plurality of blue color filters. Each red color filter may transmit red visible light having a first wavelength band. Each green color filter may transmit green visible light having a second wavelength band shorter than the first wavelength band. Each blue color filter may transmit blue visible light having a third wavelength band shorter than the second wavelength band. The color filter layer 130 may be formed in regions defined by the first to third grid structures ARD_1 to ARD_3 over the substrate layer 110.

The lens layer 140 may include an over-coating layer 142 and a plurality of microlenses 144. The over-coating layer 142 may be formed over the color filter layer 130. The over-coating layer 142 may operate as a planarization layer to compensate for (or remove) a step difference caused by the color filter layer 130. The microlenses 144 may be formed over the over-coating layer 142. Each of the microlenses 144 may be formed in a hemispherical shape, and may be formed for each of the unit pixels PX_R, PX_G, and PX_B or for each of the sub-pixel blocks PB_R, PB_G, and PB_B. The microlenses 144 may converge incident light, and may transmit the converged light to the corresponding color filters. The over-coating layer 142 and the microlenses 144 may be formed of the same materials.

As described above, the grid structure ARD based on some implementations of the disclosed technology may include the air layer. Air layers of different grid structure are not connected to each other and air layers of the first to third grid structures ARD_1 to ARD_3 are structurally separate from each other, thereby dispersing the pressure in the grid structure ARD.

In some example implementations, the grid structures are formed in a mesh-type structure in which the air layers of the entire pixel array 100 are interconnected to one region. When the air layer is expanded due to fabrication processes or environments around the air layer (e.g., a high-temperature condition), a vulnerable point may exist in a specific portion of the second capping layer 128 due to the pressure concentrated in the specific portion. Such a vulnerable point can cause collapse or damage to the second capping layer 128 due to the pressure concentrated in the specific portion. The internal pressure at the vulnerable point may increase in proportion to the increase in the temperature and volume of the air layer. In the case of using the mesh-type structure in which the air layers of the entire pixel array 100 are interconnected to a single region, pressures corresponding to the volume of the air layers of the entire grid structure can be applied to the vulnerable point, which causes collapse or damage to the pixel array in the vulnerable point.

On the other hand, as described above, when the first to third grid structures ARD_1 to ARD_3 have separate air layers, the air pressure applied to the vulnerable point may be dispersed among the first to third grid structures ARD_1 to ARD_3, instead of being concentrated at a certain location of the air layer of the entire grid structure ARD, minimizing the potential damage to the air grid structure.

Also, as described above, if each of the sub-pixel blocks PB_R, PB_G, and PB_B includes 9 unit pixels of the same color arranged in a (3×3) array, the unit pixels located in the central portion of each sub-pixel block are in contact with unit pixels of the same color in four directions, but the unit pixels at the outermost region of each sub-pixel block are in contact with the unit pixels of other colors. Accordingly, the outermost unit pixels of the sub-pixel blocks PB_R, PB_G, and PB_B may be affected by adjacent pixels of different colors when crosstalk occurs. Therefore, the disclosed technology can be implemented in some embodiment to reduce signal deviation between the outermost unit pixels in each sub-pixel block by forming the grid structures in a regular shape.

To this end, in some embodiments of the disclosed technology, each of the grid structures ARD_1 and ARD_2 in the boundary region between the color filter blocks of the sub-pixel blocks PB_R, PB_G, and PB_B may be formed in a linear shape extending in the first direction or the second direction, thereby surrounding the color filter blocks. In addition, the grid structure ARD_3 in the region defined by the grid structures ARD_1 and ARD_2 may be formed in a hash symbol shape or a square shape separated from the grid structures ARD_1 and ARD_2.

Accordingly, in the unit pixels located at the outermost region of each of the sub-pixel blocks PB_R, PB_G, and PB_B, the color filters of the unit pixels at the vertex points of the sub-pixel blocks PB_R, PB_G, and PB_B may be surrounded by the first to third grid structures ARD_1 to ARD_3, and the color filters of the unit pixels spaced apart from the vertex points of the sub-pixel blocks PB_R, PB_G, and PB_B may be surrounded by the third grid structure ARD_3 and any one of the first grid structure ARD_1 and the second grid structure ARD_2.

FIGS. 4A to 4D are cross-sectional views illustrating example methods for forming the grid structure ARD shown in FIG. 2. Since the first to third grid structures ARD_1 to ARD_3 have the same cross-sectional structure, the first to third grid structures ARD_1 to ARD_3 based on some implementations of the disclosed technology will hereinafter be described with reference to the same drawings, without being described separately from each other.

Figure 4A:
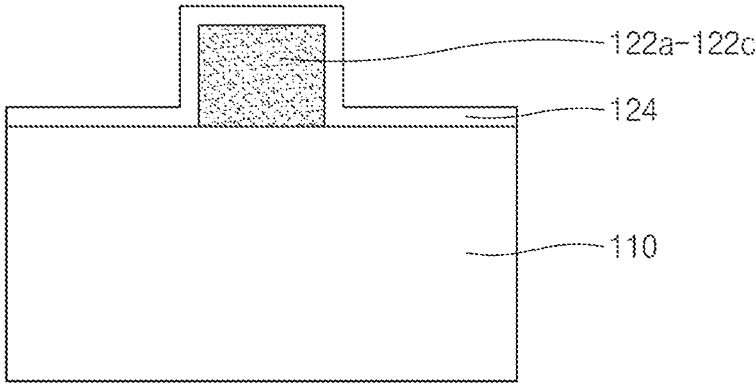
FIGS. 4A to 4D are cross-sectional views illustrating example methods for forming a grid structure shown in FIG. 2 based on some implementations of the disclosed technology.

Referring to FIG. 4A, the metal layers 122*a* to 122*c* may be formed over the substrate layer 110 including the device isolation structure 116 and the photoelectric conversion regions 114.

For example, after forming a metal layer over the substrate layer 110, a mask pattern such as a photoresist pattern (not shown) for defining a region to be used for formation of the grid structure ARD may be formed over the metal layer. In this case, the metal layer may include tungsten. Subsequently, the metal layer may be etched using the mask pattern as an etch mask, resulting in formation of the metal layers 122*a* to 122*c*.

Subsequently, the first capping layer 124 may be formed over the substrate layer 110 and the metal layers 122*a* to 122*c*. The first capping layer 124 may include a nitride layer.

Figure 4B:
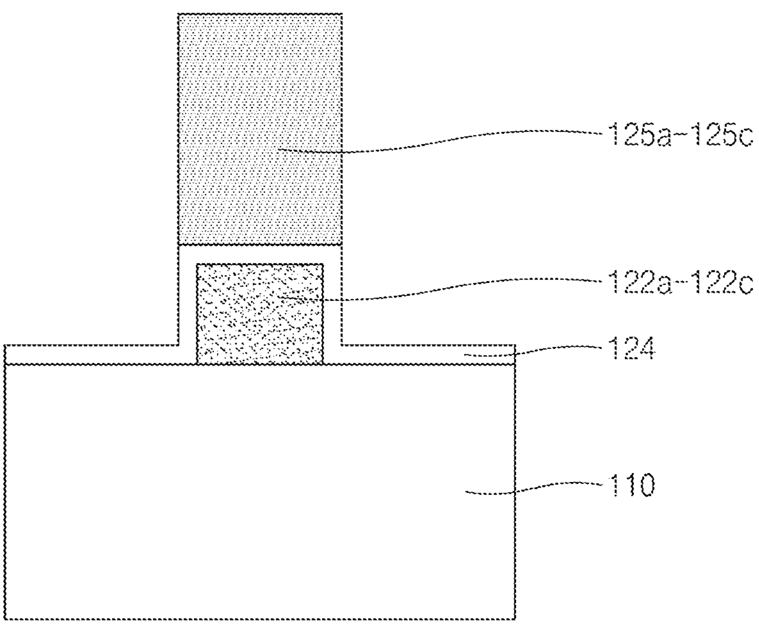

Referring to FIG. 4B, the sacrificial layer patterns 125*a* to 125*c* may be formed in regions where the air layers 126*a* to 126*c* are to be formed on the first capping layer 124.

For example, after a sacrificial layer (not shown) is formed over the entirety of the first capping layer 124, a mask pattern (photoresist pattern) (not shown) for defining a region to be used for formation of the air layers 126*a* to 126*c* may be formed over the sacrificial layer. In this case, the sacrificial layer may include a carbon-containing Spin On Carbon (SOC) film. Subsequently, the sacrificial layer may be etched using the mask pattern as an etch mask, resulting in formation of the sacrificial layer patterns 125*a* to 125*c*.

Figure 4C:
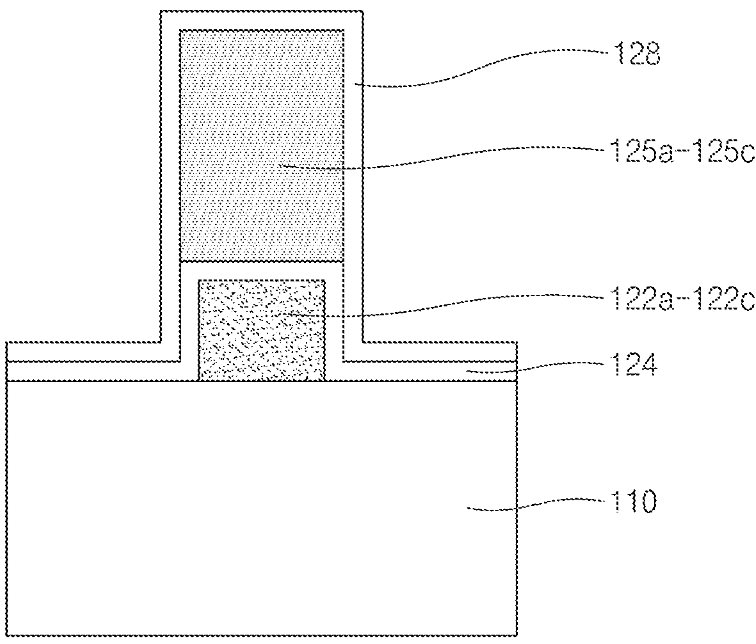

Referring to FIG. 4C, a second capping layer 128 may be formed over the first capping layer 124 and the sacrificial layer patterns 125*a* to 125*c*.

In this case, the capping layer 128 may include an ultra-low temperature oxide (ULTO) film. In some implementations, the second capping layer 128 may be formed to a predetermined thickness through which molecules formed by combining gas used in plasma process with carbon of the sacrificial layer patterns 125*a* to 125*c* can be easily discharged outside.

Figure 4D:
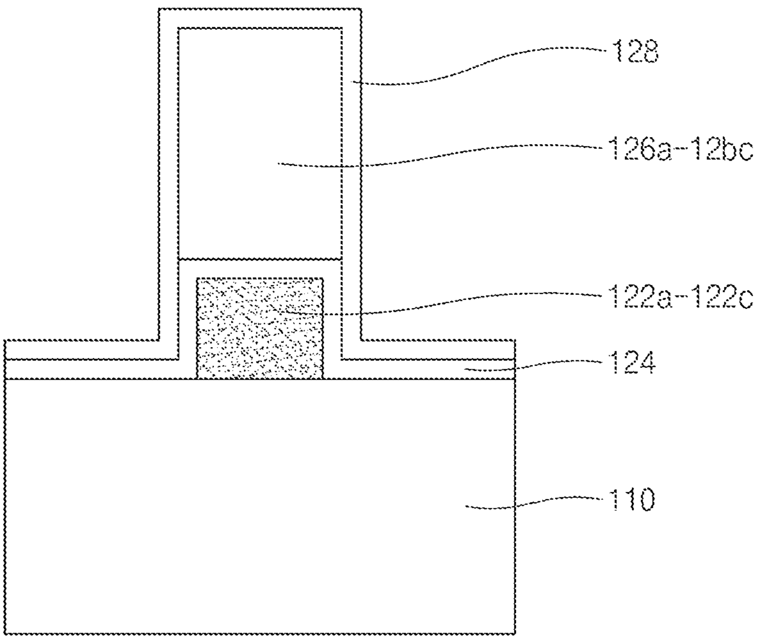

Referring to FIG. 4D, a plasma process may be carried out upon the resultant structure of FIG. 4C, so that sacrificial layer patterns 125*a* to 125*c* may be removed and the air layers 126*a* to 126*c* may be formed at the position from which the sacrificial layer patterns 125*a* to 125*c* are removed. In this case, the plasma process may be carried out using gas (e.g., $O_2$, $N_2$, $H_2$, CO, $CO_2$, or $CH_4$) including at least one of oxygen, nitrogen, and hydrogen.

For example, if the $O_2$ plasma process is carried out upon the resultant structure of FIG. 4C, oxygen radicals (O*) may flow into the sacrificial layer pattern 125*a* to 125*c* through the second capping layer 128, and the oxygen radicals (O*) included in the sacrificial layer may be combined with carbons of the sacrificial layer pattern 125, resulting in formation of CO or $CO_2$. The formed CO or $CO_2$ may be discharged outside through the second capping layer 128.

As a result, the sacrificial layer patterns 125*a* to 125*c* may be removed, and the air layers 126*a* to 126*c* may be formed at the position from which the sacrificial layer patterns 125*a* to 125*c* are removed.

Thereafter, the color filter layer 130 may be formed over the second capping layer 128 to fill regions defined by the grid structure ARD, and the lens layer 140 may be formed over the color filter layer 130.

Figure 5:
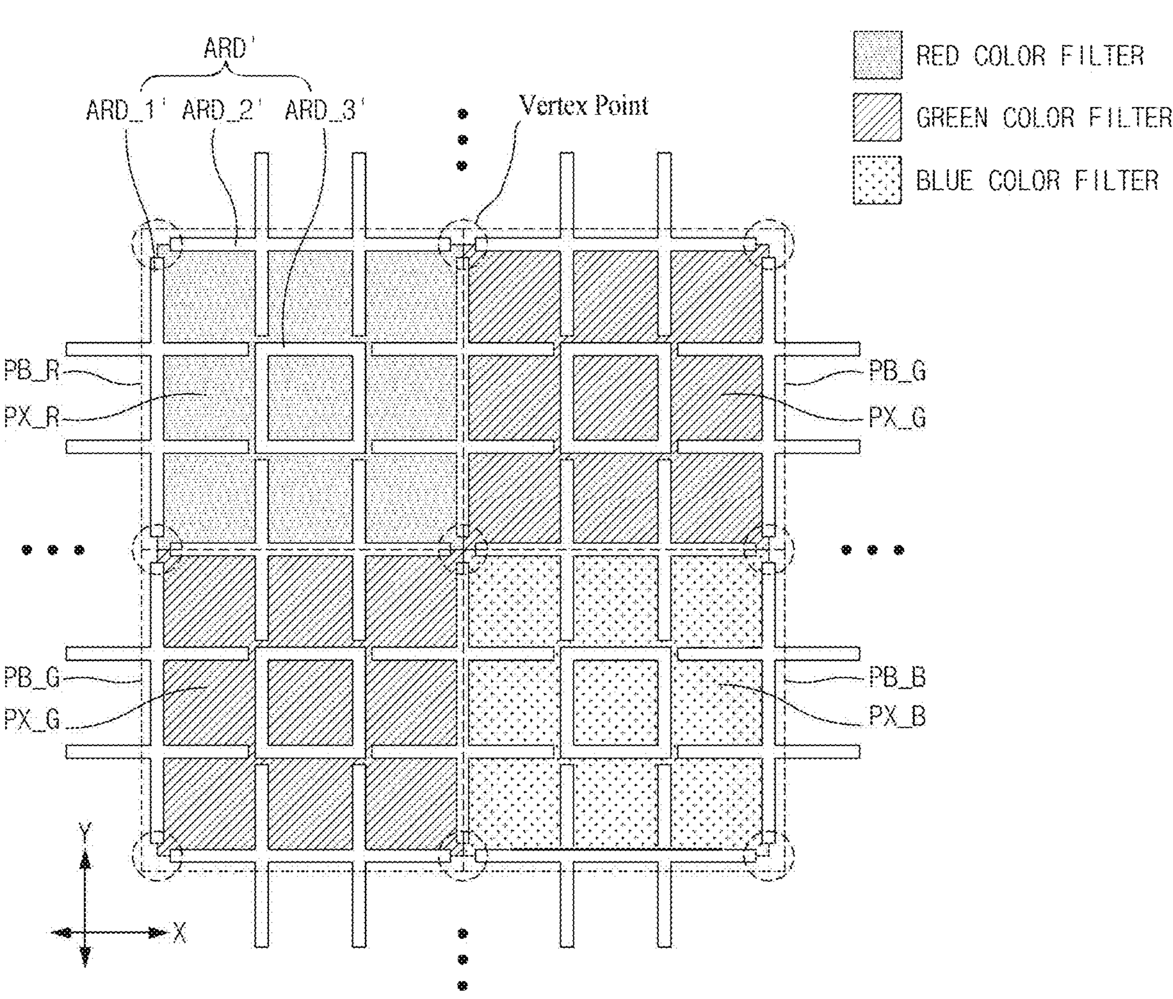
FIG. 5 is a plan view of a grid structure arranged in the pixel array shown in FIG. 1 based on some implementations of the disclosed technology.

FIG. 5 is a plan view of a grid structure arranged in the pixel array 100 shown in FIG. 1 based on some implementations of the disclosed technology.

Referring to FIG. 5, the pixel array 100 may include a plurality of sub-pixel blocks PB_R, PB_G, and PB_B. Each sub-pixel block PB_R, PB_G, or PB_B may include a structure in which the unit pixels PX_R, PX_G, or PX_B having color filters of the same color are arranged in an (N×N) structure (where N is a natural number of 3 or greater).

A grid structure ARD' for preventing crosstalk between adjacent color filters may be formed between the color filters of the unit pixels PX_R, PX_G and PX_B.

In some implementations, the grid structures ARD' includes a first grid structure ARD_1' that includes one grid structure extending in a first direction (e.g., Y-axis direction) and two grid structures extending in a second direction (e.g., X-axis direction) and connected to the grid structure extending in the first direction. In some implementations, the grid structures ARD' also includes a second grid structure ARD_2' that includes one grid structure extending in the second direction and two grid structures extending in the first direction and connected to the grid structure extending in the second direction. In some implementations, the grid structures ARD' also includes a third grid structure ARD_3' that includes two grid structures extending in the second direction and two grid structures extending in the first direction and connected to the grid structures extending in the second direction.

In some embodiments of the disclosed technology, the grid structure ARD' may include first grid structures ARD_1' and second grid structures ARD_2' disposed between color filter blocks of adjacent sub-pixel blocks PB_R, PB_G, and PB_B, and may further include third grid structures ARD_3' surrounded by the first grid structures ARD_1' and the second grid structures ARD_2' and located at the center of the color filter blocks.

For example, the first grid structures ARD_1' may include one grid structure extending in a first direction and having a first length and a plurality of grid structures each extending in a second direction and having a second length shorter than the first length. The grid structure extending in the first direction and the plurality of grid structures each extending in the second direction are arranged to cross each other and connected to each other or integrated into a single structure. Each of the second grid structures ARD_2' may include one grid structure extending in the second direction and having a first length and a plurality of grid structures each extending in the first direction and having a second length. The grid structure extending in the second direction and the plurality of grid structures each extending in the first direction are arranged to cross each other and connected to each other or integrated into a single structure. The first grid structures ARD_1' and the second grid structures ARD_2' may be disposed to cover at least two surfaces of the outermost color filters of the color filter block, leaving gaps or openings at vertex regions of the color filter block. The third grid structures ARD_3' may be formed in an annular shape surrounding one unit pixel located at the center of each of the sub-pixel blocks PB_R, PB_G, and PB_B.

Accordingly, in the unit pixels located at the outermost region of each of the sub-pixel blocks PB_R, PB_G, PB_B, the color filters of the unit pixels (vertex pixels) at vertex points of the sub-pixel blocks PB_R, PB_G, and PB_B may be surrounded by the first grid structures ARD_1' and the second grid structures ARD_2', the color filters of the unit pixels disposed between the vertex pixels may be surrounded by the third grid structures ARD_3' and any one of the first grid structures ARD_1' and the second grid structures ARD_2'.

Each of the first to third grid structures ARD_1' to ARD_3' may include an air layer, and the air layers of the first to third grid structures ARD_1' to ARD_3' may be isolated or separated from each other. The first to third grid structures ARD_1' to ARD_3' may have the same cross-sectional structure as in the grid structure ARD of FIG. 2. For example, each of the first to third grid structures ARD_1' to ARD_3' may have a hybrid structure in which the air layer and the metal layer are stacked in common.

Figure 6:
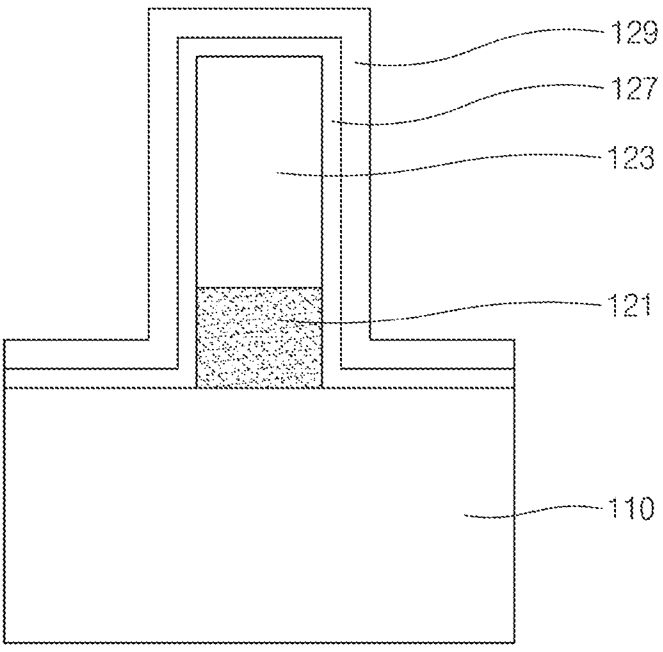
FIG. 6 is a cross-sectional view illustrating an example of a grid structure based on some implementations of the disclosed technology.

FIG. 6 is a cross-sectional view illustrating an example of a grid structure based on some implementations of the disclosed technology.

Referring to FIG. 6, each of the grid structures ARD and ARD' may include a metal layer 121, an air layer 123, a first capping layer 127, and a second capping layer 129.

The metal layer 121 may be disposed over the substrate layer 110. The metal layer 121 may be formed of a metal material (e.g., tungsten) having a high light absorption rate, or may also be formed by stacking different kinds of materials.

The air layer 123 may be disposed over the metal layer 121 to contact the metal layer 121.

The first capping layer 127 may be formed to cover the metal layer 121 and the air layer 123. The first capping layer 127 may be an ultra-low temperature oxide (ULTO) film such as a silicon oxide ($SiO_2$) film.

The second capping layer 129 may be formed over the first capping layer 127 to cover the metal layer 121, the air layer 123, and the first capping layer 127. That is, the stacked structure of the metal layer 121 and the air layer 123 may be covered with a double layer in which the first capping layer 127 and the second capping layer 129 are stacked. The second capping layer 129 may be an insulation layer that includes at least one of a silicon oxide nitride ($Si_xO_yN_z$, where each of 'x', 'y', and 'z' is a natural number) film and a silicon nitride ($Si_xN_y$, where each of 'x' and 'y' is a natural number) film. The second capping layer 129 may be thicker than the first capping layer 127 to stably maintain the shape of the grid structure. The second capping layer 129 may be formed of the same materials as those of the first capping layer 127.

Although the embodiments described above have disclosed a structure in which each of the grid structures ARD and ARD' includes a stacked structure of the metal layer and the air layer for convenience of description, the scope or spirit of the disclosed technology is not limited thereto, and it should be noted that each of the grid structures ARD and ARD' does not include the metal layer and allows only the air layer to be covered by the capping layer.

FIGS. 7A to 7D are cross-sectional views illustrating example methods for forming the grid structure shown in FIG. 6 based on some implementations of the disclosed technology.

Figure 7A:
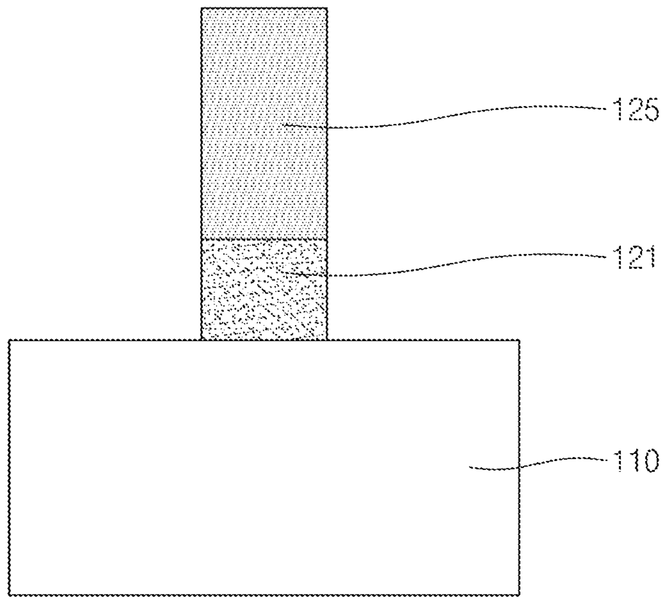
FIGS. 7A to 7D are cross-sectional views illustrating example methods for forming the grid structure shown in FIG. 6 based on some implementations of the disclosed technology.

Referring to FIG. 7A, a metal layer 121 and a sacrificial layer pattern 125 may be formed over the substrate layer 110 including the photoelectric conversion regions 114 and the device isolation structure 116.

For example, after the metal layer and the sacrificial layer are sequentially stacked over the substrate layer 110, a mask pattern (photoresist pattern) (not shown) for defining a region to be used for formation of the grid structure may be formed over the sacrificial layer. In this case, the metal layer may include tungsten, and the sacrificial layer may include a carbon-containing Spin On Carbon (SOC) film. Subsequently, the metal layer and the sacrificial layer may be etched using the mask pattern as an etch mask, resulting in formation of the metal layer 121 and the sacrificial layer pattern 125.

Figure 7B:
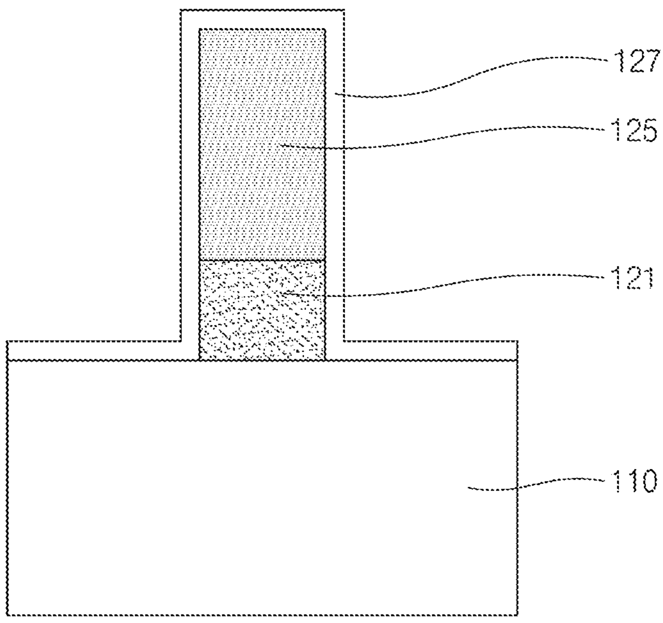

Referring to FIG. 7B, the first capping layer 127 may be formed over the substrate layer 110, the metal layer 121, and the sacrificial layer pattern 125. The first capping layer 127 may include an ultra-low temperature oxide (ULTO) film. In some implementations, the first capping layer 127 may be formed to a predetermined thickness through which molecules formed by combining gas used in plasma process with carbon of the sacrificial layer pattern 125 can be easily discharged outside.

Figure 7C:
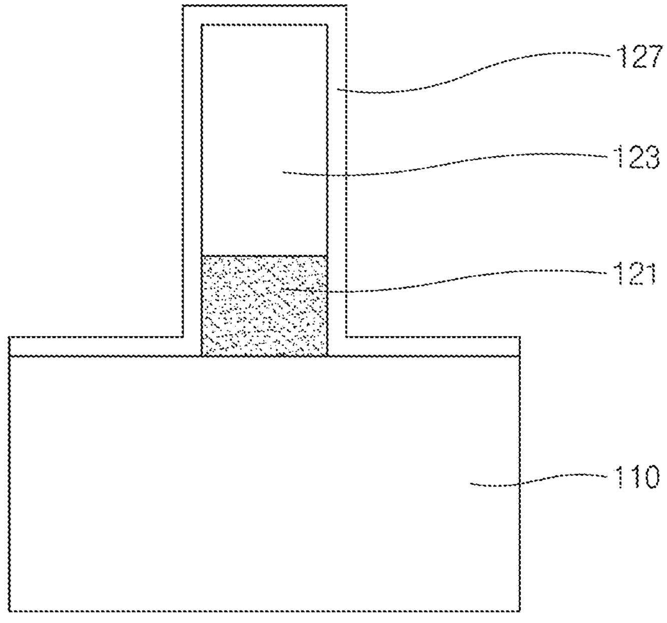

Referring to FIG. 7C, a plasma process may be carried out upon the resultant structure of FIG. 7B, so that sacrificial layer pattern 125 may be removed and the air layer 123 may be formed at the position from which the sacrificial layer pattern 125 is removed as described in FIG. 4D.

Figure 7D:
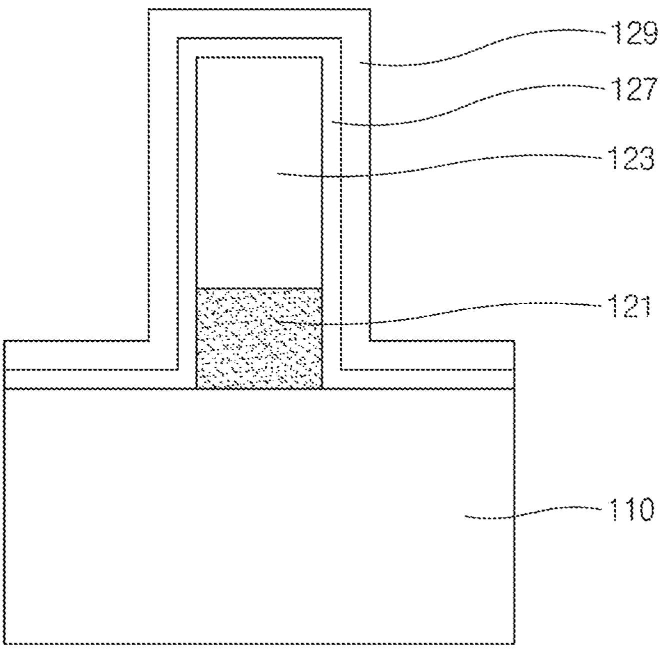

Referring to FIG. 7D, the second capping layer 129 may be formed over the first capping layer 127. The second capping layer 129 may be an insulation layer that includes at least one of a silicon oxide nitride ($Si_xO_yN_z$, where x, y, and z are natural numbers) film and a silicon nitride ($Si_xN_y$, where x and y are natural numbers) film. The second capping layer 129 may be thicker than the first capping layer 127 to stably maintain the shape of the grid structure. The second capping layer 129 may be formed of the same materials as those of the first capping layer 127.

As is apparent from the above description, the image sensing device based on some implementations of the disclosed technology can increase the structural stability of a grid structure that includes an air layer by forming a specific pattern for the grid structure, thereby minimizing signal deviation between pixels.

The embodiments of the disclosed technology may provide a variety of effects capable of being directly or indirectly recognized through the above-mentioned patent document.

Although a number of illustrative embodiments have been described, it should be understood that modifications or enhancements to the disclosed embodiments and other embodiments can be devised based on what is described and/or illustrated in this patent document.

What is claimed is:

1. An image sensing device comprising:

a plurality of color filter blocks, each of which includes a plurality of color filters arranged adjacent to each other in a first direction and a second direction perpendicular to the first direction and having the same color;

first grid structures including a first air layer and disposed directly between the color filter blocks adjacent to each other in the first direction;

second grid structures including a second air layer and disposed directly between the color filter blocks adjacent to each other in the second direction; and a third grid structure including a third air layer and disposed directly between the color filters within each of the color filter blocks, wherein each of the first to third air layers is structurally separate from each other.

2. The image sensing device according to claim 1, wherein:

the color filters having the same color in each of the color filter blocks are arranged in an (N×N) structure, wherein N is a natural number greater than or equal to 3.

3. The image sensing device according to claim 1, wherein:

the first grid structures extend in the first direction.

4. The image sensing device according to claim 3, wherein:

the second grid structures extend in the second direction.

5. The image sensing device according to claim 4, wherein:

the third grid structure include a plurality of first branch grid structures extending in the first direction and a plurality of second branch grid structures extending in the second direction, and wherein the first and second branch grid structures are arranged to cross each other and connected to each other.

6. The image sensing device according to claim 1, wherein:

among the color filters disposed at the outermost region of each of the color filter blocks, first color filters in contact with vertex points of a corresponding color filter block are surrounded by the first to third grid structures; and second color filters not in contact with the vertex points of the corresponding color filter block are surrounded by the third grid structure and any one of the first grid structure and the second grid structure.

7. The image sensing device according to claim 1, wherein:

the first grid structures include one grid structure extending in the first direction and a plurality of grid structures extending in the second direction that are connected to each other and arranged to cross each other.

8. The image sensing device according to claim 7, wherein:

the second grid structures include one grid structure extending in the second direction and a plurality of grid structures extending in the first direction that are connected to each other and arranged to cross each other.

9. The image sensing device according to claim 8, wherein:

the third grid structure is formed in an annular shape surrounding a unit pixel located at a center portion of the color filter block.

10. The image sensing device according to claim 1, wherein:

among the color filters disposed at the outermost region of each of the color filter blocks, first color filters in contact with vertex points of a corresponding color filter block are surrounded by the first grid structure and the second grid structure; and second color filters not in contact with the vertex points of the corresponding color filter block are surrounded by the third grid structure and any one of the first grid structure and the second grid structure.

11. The image sensing device according to claim 1, wherein each of the first to third grid structures further includes:

a metal layer disposed below each of the first to third air layers.

12. The image sensing device according to claim 11, wherein the first to third grid structures includes:

a first capping layer disposed between the metal layer and the first to third air layers; and a second capping layer formed to cover the first to third air layers.

13. The image sensing device according to claim 11, wherein the first to third grid structures further includes:

a first capping layer formed to cover the metal layer and the first to third air layers; and a second capping layer formed over the first capping layer.

14. The image sensing device according to claim 1, wherein the color filter blocks include:

a first color filter block in which a plurality of first color filters having first color is arranged adjacent to each other;

a second color filter block adjacent to the first color filter block in the first direction, and configured to include a plurality of second color filters having second color arranged adjacent to each other; and a third color filter block adjacent to the second color filter block in the second direction, and configured to include a plurality of third color filters having third color arranged adjacent to each other.

15. An image sensing device comprising:

a color filter block including a plurality of color filters arranged adjacent to each other in a first direction and a second direction perpendicular to the first direction;

a plurality of first grid structures disposed along boundary regions located at first and third sides of the color filter block arranged in the first direction to be in contact with the first and third sides of the color filter block, the plurality of first grid structures including a first air layer;

a plurality of second grid structures disposed along boundary regions located at second and fourth sides of the color filter block arranged in the second direction to be in contact with the second and fourth sides of the color filter block, the plurality of second grid structures including a second air layer; and a third grid structure disposed directly between the color filters within the color filter block, the third grid structure including a third air layer, wherein each of the first to third air layers is structurally separate from each other.

16. The image sensing device according to claim 15, wherein:

the color filters are color filters having the same color.

17. The image sensing device according to claim 15, wherein:

each of the first grid structure and the second grid structure extends in a certain direction.

18. The image sensing device according to claim 17, wherein:

the third grid structure includes a plurality of grid structures extending in the first direction and a plurality of other grid structures extending in the second direction, and wherein the grid structures and the other grid structures are connected to each other and arranged to cross each other.

19. The image sensing device according to claim 15, wherein:

each of the first and second grid structures includes a grid structure extending in the first direction and other grid structure extending in the second direction, and wherein the grid structure and the other grid structure are connected to each other and arranged to cross each other.

20. The image sensing device according to claim 19, wherein:

the third grid structure is formed in an annular shape surrounding a unit pixel located at a center portion of the color filter block.

* * * * *